United States Patent [19]

Brock et al.

[11] 3,789,391

[45] Jan. 29, 1974

[54] COURSE/FINE SYNCHRO ALTIMETER CONVERTER

[75] Inventors: Larry D. Brock, Collinsville; John E. Games, Granby; John Saunders, East Hartford, all of Conn.

[73] Assignee: United Aircraft Corporation, East Hartford, Conn.

[22] Filed: July 3, 1972

[21] Appl. No.: 268,254

[52] U.S. Cl. ...... 340/347 SY, 340/347 AD, 318/594

[51] Int. Cl. ........................................... H03k 13/02

[58] Field of Search ....... 340/198, 347 SY, 347 AD; 235/150.2, 92 MP; 73/384; 318/594

[56] References Cited

UNITED STATES PATENTS

| | | | |
|---|---|---|---|
| 3,311,910 | 3/1967 | Doyle | 340/347 AD |
| 3,638,219 | 1/1972 | Harms | 340/347 AD |
| 3,623,071 | 11/1971 | Bentlye | 340/347 AD |
| 3,315,253 | 4/1967 | Geller | 340/347 SY |
| 3,223,830 | 12/1965 | Evans | 340/347 SY |
| 2,949,779 | 8/1960 | McKenny | 73/384 |

*Primary Examiner*—Charles D. Miller
*Attorney, Agent, or Firm*—Melvin Pearson Williams

[57] ABSTRACT

A DC signal representative of the rotary position of a fine synchro altimeter is subtracted from a DC signal representative of the angular position of a coarse synchro altimeter so as to provide a coarse staircase, the step positions of which are accurately aligned with the fine altimeter transition from maximum to minimum altitude indication. This staircase is used to select corresponding voltages, stepwise fashion, which are precisely generated so as to generate a staircase in which the voltage levels, as well as the positioning of the steps, are extremely precise. The fine altimeter voltage is added to the precise staircase so as to generate a precise DC signal of altitude. The voltage outputs of the fine synchro altimeter are resolved to a smooth, linear voltage as the function of altitude by means of electronic resolution equipment employing an RC/CR bridge, the input signals of which are reversed for a range of shaft angles displaced from 0° and 360° rotation; angular and voltage biases are also provided in this signal conditioning.

8 Claims, 8 Drawing Figures

COURSE/FINE SYNCHRO ALTIMETER CONVERTER

BACKGROUND OF THE INVENTION

1. Field of the Invention

This invention relates to altimeter converters, and more particularly to an extremely precise coarse/fine synchro altimeter converter.

2. Description of the Prior Art

Combined coarse/fine synchro altimeters are widely used in the art. Typically, the fine altimeter synchro may provide rotations of 0° to 360° of its shaft which correspond to altitudes of between zero and five thousand feet, whereas the coarse altimeter may provide in 360° of shaft rotation, values relating to altitudes of from zero to 135,000 feet. The fine altimeter synchro can be extremely accurate, but the coarse altimeter synchro is extremely inaccurate due to its large range. As used for altimeter readings, each synchro drives a corresponding needle on a rotary altimeter indicator. The needle positions correspond with the synchro shaft positions.

In the employment of aircraft navigation computing apparatus, there are many instances where an input relating to aircraft altitude is required in the computations. This necessitates, in general, providing a single signal, some characteristic of which is proportional to aircraft altitude. This signal should be developed to the same degree of accuracy as the accuracy inherent in the altimeter itself. This is particularly difficult in the case where coarse and fine altimeter synchros must be utilized as the inputs to the conversion circuitry; for instance, care must be taken not to provide simply additive DC voltage, because of the inaccuracy of the coarse altitude synchro. If switching techniques are utilized, all of the switching points (in time) must be carefully synchronized. There must be no ambiguous cases. The accuracy should be on the order of 40 or 50 feet out of 45,000 feet (something like 0.1 percent of full scale). In addition, any digital or combinatorial methods utilized to generate a single signal should be non volatile: that is, it should not rely on history to provide inaccurate output, but rather should be able to provide an accurate output even following a power failure or other interruption.

SUMMARY OF INVENTION

The principal object of the present invention is to provide an extremely accurate coarse/fine synchro altimeter conversion.

Another object is to provide improved synchro resolution.

According to the present invention, a voltage representing the output of a fine altimeter synchro is subtracted from a voltage representing the output of a coarse altimeter synchro so as to generate a rough staircase; the rough staircase is utilized to select corresponding discrete precision voltages to present a precise staircase representative of incremental coarse steps of altitude; the fine altitude voltage is added to the precise staircase so as to provide a precise continuous DC representation of altitude.

Another object of the invention is to provide for the electronic generation of a voltage indicative of the rotary angle of a synchro shaft, without any ambiguity resulting from jitter about a transition point (such as from 360°− to 360°+).

According to this aspect of the present invention, electric signals representing combinations of a plurality of synchro output signals are selectively inverted for signals representative of certain angles to thereby provide inputs to an RC/CR bridge which represent the same magnitudes for a range of one half-revolution of shaft angle as for the other half-revolution of shaft angles, the sign of the quadrant of shaft angle is resolved and biases are provided in such a fashion to generate a completely monotonic unambiguous output, which can be averaged to a DC signal without ambiguity at transition points.

The present invention provides an extremely accurate coarse/fine synchro altimeter converter which is easily implemented using technology readily available in the art.

Other objects, features and advantages of the present invention will become more apparent in the light of the following detailed description of preferred embodiments thereof, as illustrated in the accompanying drawing.

DESCRIPTION OF THE PREFERRED EMBODIMENT

As is known, the altimeter per se is precisely accurate. As is also known, the fine altimeter is precisely accurate (on the order of a tenth of a per cent); however, the coarse altitude altimeter synchro is not very precise since it has such an extremely large range it is very difficult to get precision at any point within the range. The present invention converts the approximate coarse altitude signal to a very precise coarse altitude staircase and adds the precise fine altitude signal thereto in order to provide a precise continuous voltage as a function of altitude; the precision which is achievable in accordance with the invention is nearly equal to the precision of the fine altimeter synchro output.

Figures 1, 2, 3:
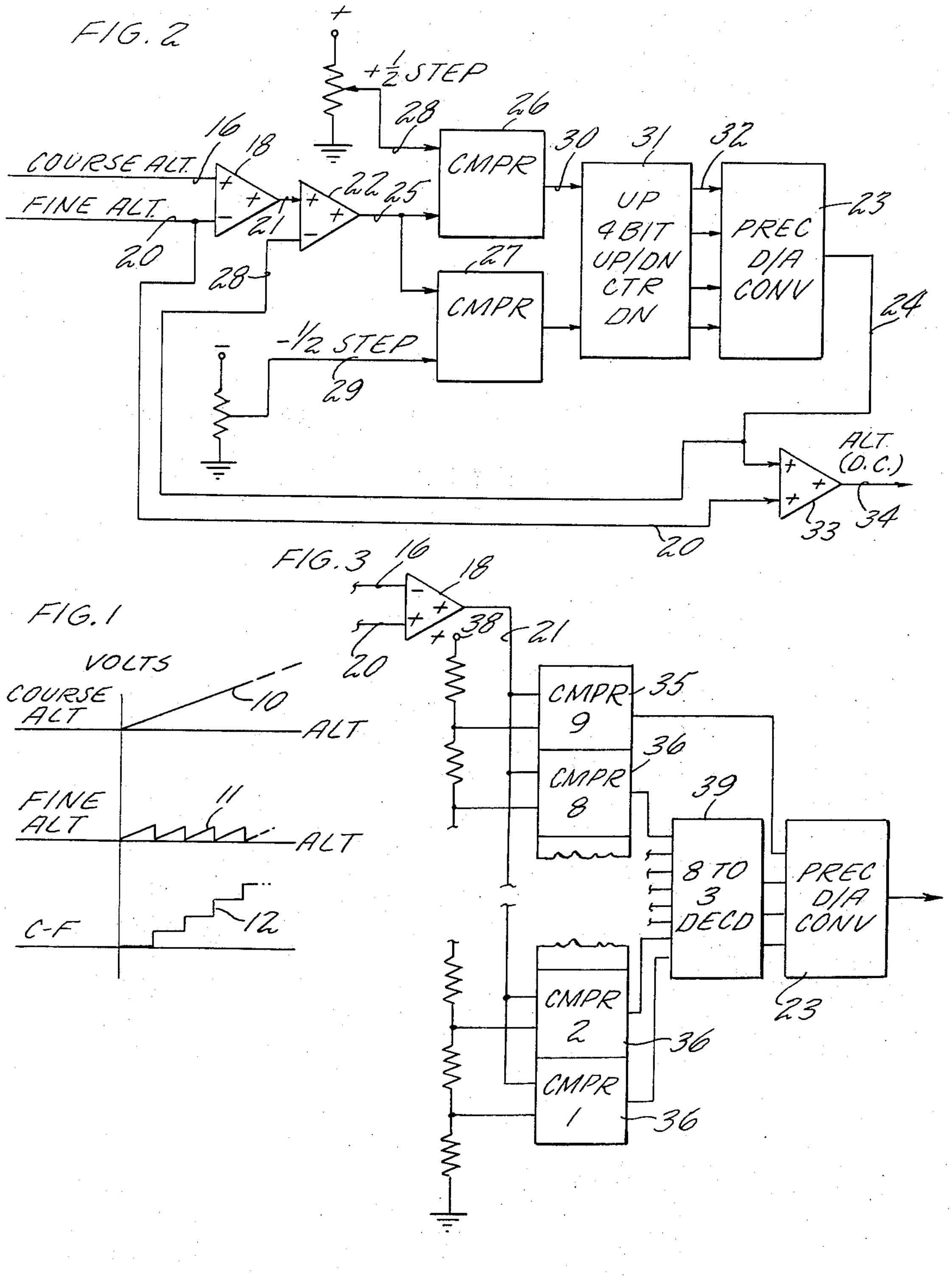
FIG. 1 is a simplified diagram illustrating the staircase method of the present invention.
FIG. 2 is a simplified schematic block diagram of a preferred embodiment of coarse/fine altimeter signal conversion circuitry in accordance with the present invention.
FIG. 3 is a simplified schematic block diagram of an alternative embodiment of a coarse/fine altitude converter according to the invention.

Referring now to FIG. 1 a curve of a DC voltage as a function of coarse altitude is illustrated by a plot 10 and a DC voltage as a function of fine altitude is illustrated by a plot 11. In FIG. 1, altitudes of from about zero to about 20,000 feet are illustrated. In accordance with the invention, the fine altitude voltage is subtracted from the coarse altitude voltage so as to provide a coarse staircase voltage, the steps of which are representative of fine-altitude increments of coarse altitude. This is illustrated by the plot 12. Because of the inaccuracy inherent in the coarse synchro, the DC voltages which are generated can be no more accurate than the synchro positions which they represent. Therefore, the voltage magnitudes at each step of the coarse minus fine (C-F) staircase voltage 12 are not very precise. However, the altitude transition points are precisely located (in values of altitude) to the transition in the fine altitude signal 11. In accordance with the invention, the staircase waveform is used to select corresponding precise voltage levels so as to build a precise staircase, to which the fine altitude signal 12 is added so as to provide a continuous, precise voltage as a function of altitude.

Referring now to FIG. 2, the signal 10 representing coarse altitude is applied on a line 16 to the noninverting input of a differencing amplifier 18 which also has applied to its inverting input the fine altimeter voltage on a line 20. The output of the differencing amplifier 18 comprises the staircase waveform 14 on a line 21. This is applied to the noninverting input of another differencing circuit 22 which has its inverting input connected to the output of a precision D/A converter 23 via a line 24. Assuming for the moment that the equipment has just started up, the aircraft will presumably be at a low altitude which is within 5000 feet of the lowest setting, which may be at −1250 feet. In such a case, the difference between coarse and fine will be substantially zero (depending only upon the accuracy of the coarse altimeter with respect to the accuracy of the fine altimeter) so that a signal smaller than one-half of the steps is all that will be provided at the output of the differencing circuit 22. This signal is applied on a line 25 to two comparators 26, 27 for comparison with a +½ step signal on a line 28 and a −½ step signal on a line 29. Since the coarse and fine staircases will always be within a half of a step (2500 feet) of each other, the signal on the line 25 will not be greater than a half step nor less than a half step, so neither one of the comparators 26, 27 will provide an output. However, once the aircraft starts to climb, it will eventually get to an altitude on the order of 5000 feet higher than the minimum such as 3750 feet, in which case the fine altimeter signal 11 may undergo a transition back to −1250 feet which causes the voltage on the line 21 to be equal to the first step of the staircase. At this time, since the line 25 has a voltage which is greater than one half step in magnitude, the comparator 26 will provide an output on a signal line 30 to cause a four bit up/down counter 31 to step up one count, to a count of 0001. This is passed, over a plurality of lines 32, to the precision D to A converter 23, which may typically comprise a combination of a precision resistor ladder network, switches and a precision voltage source so as to provide on its output line 24 a very precise voltage of first-step magnitude (on the order of the first step magnitude of the staircase voltage 12). This voltage is fed back on the line 24 to the inverting input of the differencing circuit 22 to cause the signal on the line 25 to again resume some low value (now dependent upon the difference in accuracy between the coarse and fine altitude signals and the difference in accuracy between their difference and the precision D to A converter first-step voltage). In any case, this voltage certainly is equivalent to less than 2500 feet and is less than one half of a step so that neither comparator 26, 27 will provide any output. If then the aircraft descends to an altitude within 5000 feet of the minimum, the fine altimeter will again transcend to its first sawtooth removing the first step voltage at the output of the difference circuit 18 so that there is substantially no input signal on the line 21 to the differencing circuit 22. However, the precision D/A converter 23 is still presenting a very precise first-step voltage on the line 24 to the differencing circuit 22. This will provide a negative step voltage on the line 25 so that the comparator 27 will sense that the voltage on the line 25 is more negative than the value of one half of a step, so it will provide an output to cause the up/down counter 31 to count down by one increment. When this happens, the precision D/A converter 23 no longer presents any output voltage on the line 28 so that eventually the output of the differencing circuit 22 again becomes substantially zero. In this fashion, the precision D/A converter is caused to follow in a precise fashion the rough altitude indications of the staircase waveform 12. Because the output of the precision D/A converter 23 is very precise, and the fine altitude voltage is precisely related to altitude, the summation of these two provide a smooth DC signal, the magnitude of which is precisely related to the altitude. This is achieved in an adder amplifier 33 which is responsive to the signal on the line 24 to add to it the fine altitude signal on the line 20 to provide a precise DC voltage as a function of altitude on a line 34.

An alternative embodiment of the invention is illustrated in FIG. 3. Therein the signal on the line 21 is applied to nine different compare circuits 35, 36, each of which compares that signal with a precise related reference voltage developed across a precision voltage divider 37 response to a precision voltage applied to a terminal 38. As the voltage on the line 21 increases by discrete steps, successive ones of the comparators will operate so as to provide successively higher-ordered inputs to an eight to three decode circuit 39, the output of which is connected to the precision D/A converter 23, except for the highest order comparator 35 which applies its signal directly to the precision D/A converter 23. The net effect is the same; a rough voltage level (one of the steps of the staircase waveform 12) on the line 22 causes a precise corresponding voltage level output of the precision D/A converter 23, with transitions whenever there is a transition in the staircase waveform on the line 21. Precise discrete output voltages of the precision D/A converter 23 are utilized in an embodiment following the teachings of FIG. 3 in the same fashion as one following the teachings of FIG. 2.

It should be understood that there are other methods of converting a rough voltage level to a fine voltage level to be added to the fine altimeter voltage to make a precise voltage output employing the teachings of the present invention. However, the embodiment of FIG. 2 represents the best mode contemplated of achieving that result.

The coarse altitude signal on the line 16 comes from a coarse altimeter which provides, in a single revolution, the entire altimeter range which may be from zero to −135,000 feet or from negative altitude such as −1000 feet to full scale. Similarly, the fine altitude signal on the line 20 may be developed by the fine altimeter which may represent, for each 360° revolution, a range of 5000 feet of altitude, and which is very accurate. The present invention described thus far may be utilized with any source of coarse and fine altitude signals and will give corresponding results. However, as is common on aircraft known to the art, the fine and coarse altimeter signals to be used as an input to the apparatus of FIG. 2 as described hereinbefore may have to be developed from existing coarse and fine altimeter synchros. This may present some problems. Devices to generate accurate electric signals from synchros are cumbersome and expensive in many cases. An exception is disclosed in a commonly owned copending application of J. E. Games, H. E. Martin and K. S. Walworth, Ser. No. 270,351, filed on July 10, 1972, a continuation of application Ser. No. 95,164 filed on Dec. 4, 1970 and entitled SYNCHRO DIGITIZER, now abandoned. The invention disclosed therein utilizes relatively simple and easily implemented electronic circuitry to first provide a pulsewidth modulation indication of the rotary position of the synchro, and thereafter to provide a digital output thereof. The invention therein is well suited, with certain modifications, for developing the coarse altimeter signal on the line 16 and the fine altimeter signal on the line 20 from altimeter synchros. The nature of the required modification, and the reasons therefor, are developed hereinafter.

Figures 4, 8:
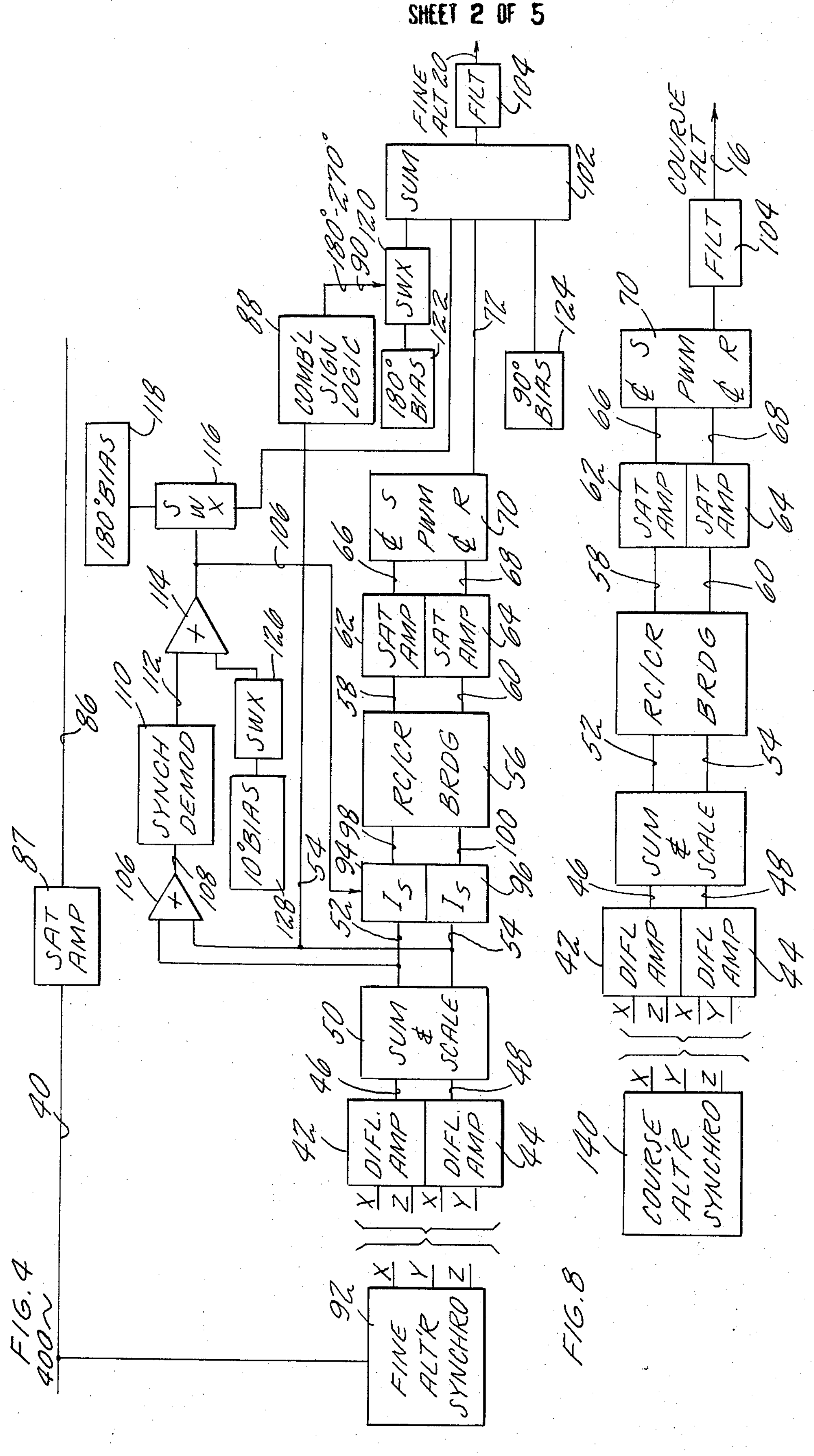
FIG. 4 is a schematic block diagram of circuitry for providing a DC signal representation of the output of a synchro without ambiguity at transition points.
FIG. 8 is a schematic block diagram of signal conditioning for the coarse altimeter herein.

Referring to FIG. 4, reference numerals between 40 and 90 correspond exactly to like reference numerals in FIG. 2 of the copending application. The modifications required for the fine synchro are illustrated with reference numerals 92 et seq. Since a full description appears in the aforementioned copending application, only significant problems and improvements thereto are described herein. Briefly, the output of a synchro, such as the fine altimeter synchro 92, comprises output signals at the reference carrier frequency (which may be 400 Hz applied to the synchro on the line 40) on the X, Y and Z lines, the relative phases of which are indicative of shaft position of the synchro. These are applied to differential amplifiers 42, 44 to provide an X-Z signal on a line 46 and a Y-Z signal on the line 48. These signals are added and scaled in a fashion so as to provide signals having a proper phase relationship for application, as in said copending application, directly to an RC/CR bridge 56. Herein, the signals on the lines 52, 54 are inverted in response to signals on the lines 52, 54 indicative of certain angles of rotation of the synchro by means of selective inverters 94, 96 which apply inputs over related lines 98, 100 to the RC/CR bridge 56; the selective inverters 94, 96 do not appear in said copending application. This is one of the modifications which is described hereinafter. The output of the RC/CR bridge 56 is a pair of signals on corresponding lines 58, 60, the relative phase of which is indicative of shaft rotation of the synchro 92. These are developed into square waves in saturating amplifiers 62, 64 for application over lines 66, 68 to respectively set and reset a dual-clocked bistable device which pulsewidth modulates the phase information, to provide pulses on the line 72, the width of which are indicative of shaft rotation. As described in said copending application, however, the RC/CR bridge provides the same output for angles of 0° through 180° (full scale output of the bridge 56) as it does for angles between 180° and 360°. For that reason, the aforementioned copending application employs combinational sign logic circuitry 88 to indicate when the angle is between 180° and 360°, thereby to resolve the ambiguity. A similar function is performed by the combinational sign logic 88 herein, as is described more fully hereinafter. A further difference as used herein is that the integrate and hold circuitry and analog to digital conversion which is disclosed in the aforementioned copending application is not required herein since an analog signal is desirable for application to the circuit of FIG. 2.

Figure 5:
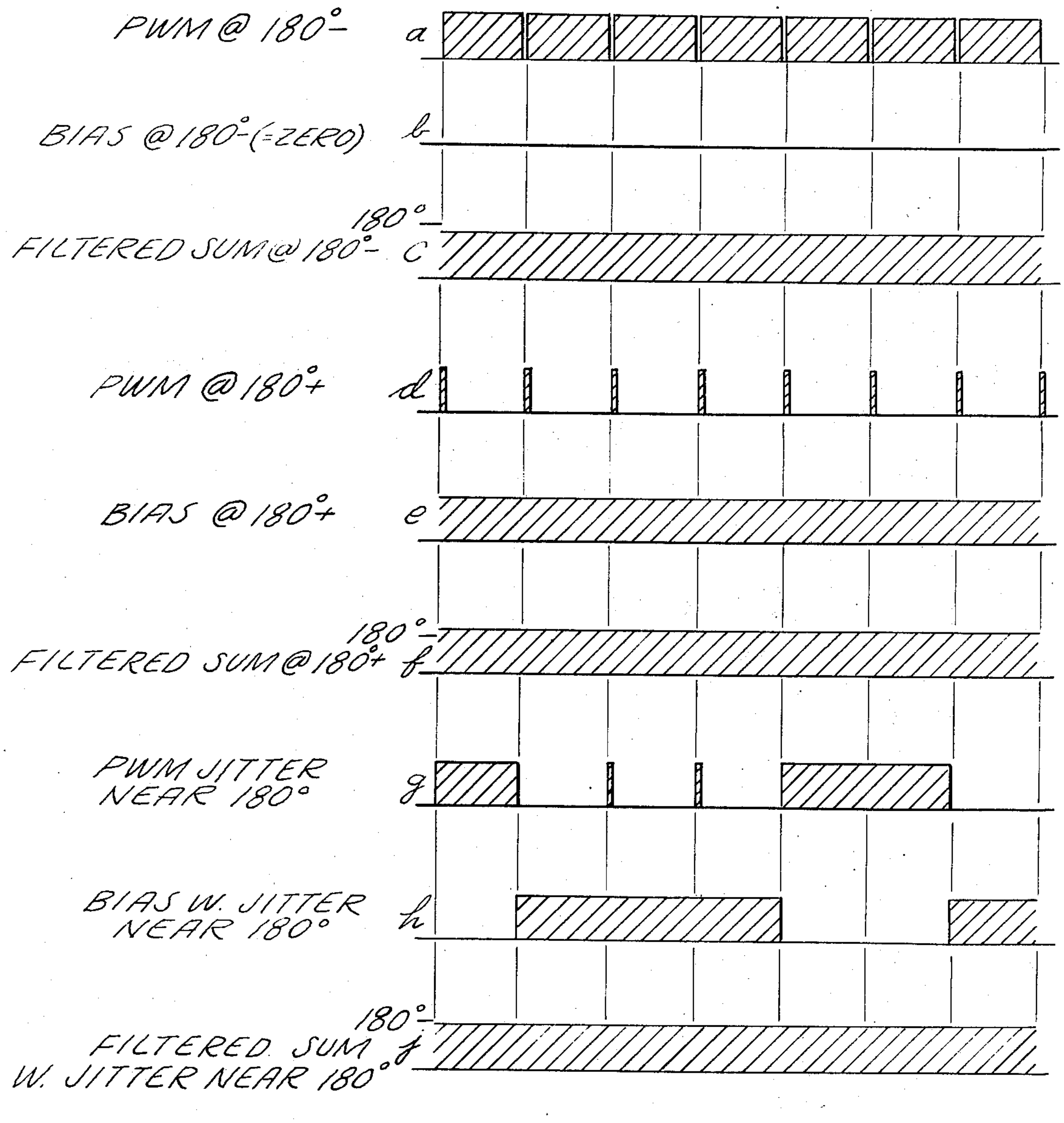
FIG. 5 is an illustration of voltage conditions in apparatus for which the apparatus of FIG. 4 provides improvement.

Consider now operation of the device of the aforementioned copending application, at near 180°, as shown in FIG. 5. In FIG. 5, illustration a shows that for angles just under 180°, the output of the pulsewidth modulator 70 is nearly continuous; that is the pulsewidth is nearly maximum. Also since the angle is less than 180°, there is no bias (as is the case for angles near 360° which require 180° of additional biasing to make them different than angles below 180°). Since a DC signal is required herein, the output of the pulsewidth modulator 70 on the line 72 is passed through a sum circuit 102 and a filter 104 so as to provide a DC indication on the line 20 of the RC/CR bridge output 56, which indication, if resolved as between half revolutions, is indicative of the shaft angle of the fine altimeter synchro 92. The output of the filter on the line 20 therefore is a DC signal having a magnitude just under the maximum DC signal magnitude as shown in illustration *c* of FIG. 5. Similarly illustrations *d, e* and *f* show that for angles just above 180°, the RC/CR bridge is now again working at the low end of the scale and the pulsewidth modulation is of a very small pulsewidth. However the output of the filter will have added to it 180° of bias to show that this small angle is an angle greater than 180° rather than less than 180°. So the small pulses of illustration *d* when added to the bias of illustration *e* and filtered provide a DC signal having a magnitude which is greater than the magnitude corresponding to 180°. If, now, the altimeter were to jitter around 180°, and alternate between being just above it and just below it, the pulsewidth modulator might provide some pulses of nearly maximum width and some of nearly minimum width as shown in illustration *g* of FIG. 5. The bias provided will appear with the narrow pulses indicating more than 180° and will disappear for the wide pulses indicating less than 180°, as shown in illustration *h* of FIG. 5. When the pulses of illustration *g* are added to the bias of illustration *h* and the result is filtered, a DC signal results, which varies slightly from 180°, as shown in illustration *j* of FIG. 5.

Figure 6:
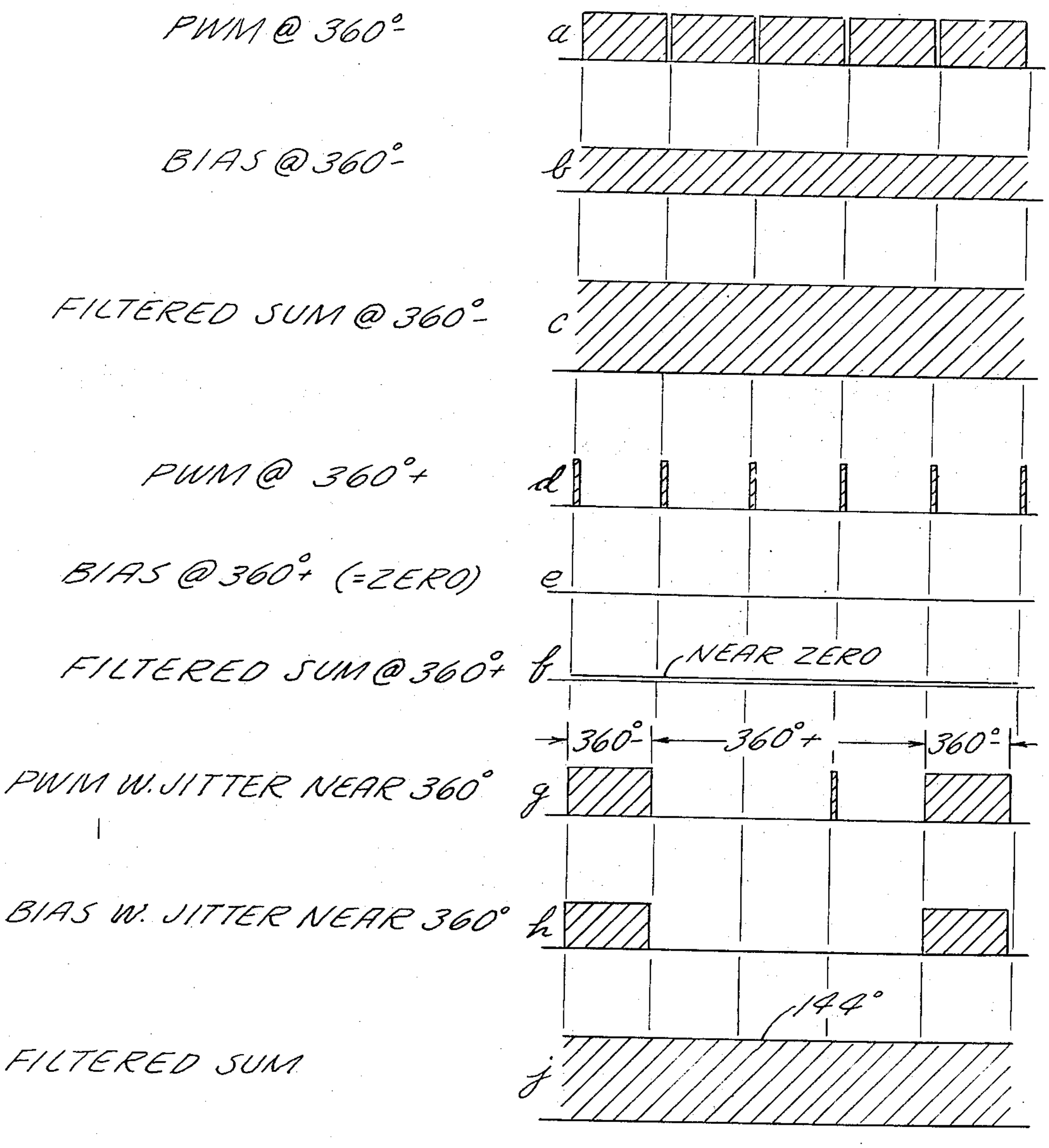
FIG. 6 is an illustration of voltage conditions in apparatus for which the apparatus of FIG. 4 provides improvement.

Consider now, however, the operation of the device of the aforementioned copending application at angles near 360° as illustrated in FIG. 6. The output of the pulsewidth modulator 70 is near maximum pulsewidth for angles just under 360° and there is a constant 180° bias for angles just under 360° to indicate that they are between 180° and 360°. The summation of these two signals and filtering provides a signal which is just about twice the amplitude as that for the case of angles just under 180° (FIG. 5), as shown in illustration *c* of FIG. 6. For angles just in excess of 360° (just above 0°) only a sliver of an output appears at the output of the pulsewidth modulator, as shown in illustration *d* of FIG. 6. No bias is provided since this represents angles between 0° and 180° as shown in illustration *e* of FIG. 6. The filtered sum, as shown in illustration *f* of FIG. 6 is a very small voltage indicating an angle near 0°.

However when the angle varies right around 360°, an ambiguity results so it is impossible to derive a meaningful output. Consider the case where for a short time the angle is under 360°, then is at exactly 360°, then is over 360° and then becomes under 360° again, as shown in illustration *g* of FIG. 6. Bias appears for angles just under 360° as shown in illustration *h* of FIG. 6. When these signals are added together, the particular configuration as shown in FIG. 6 will result in an angle of about 144° as shown in illustration *j* of FIG. 6. Depending on the mixture of angles above and below, the resulting output could be equivalent to practically any angle. Thus there is a need to provide a modification to the apparatus of the copending application to avoid the ambiguity when the fine altimeter goes from its maximum setting to its minimum setting (goes from 360°– to 360°+, and particularly when it may jitter about the 360° mark. It should also be understood that this sort of problem can result when deriving an electric signal from any type of synchro, not merely an altimeter.

Figure 7:
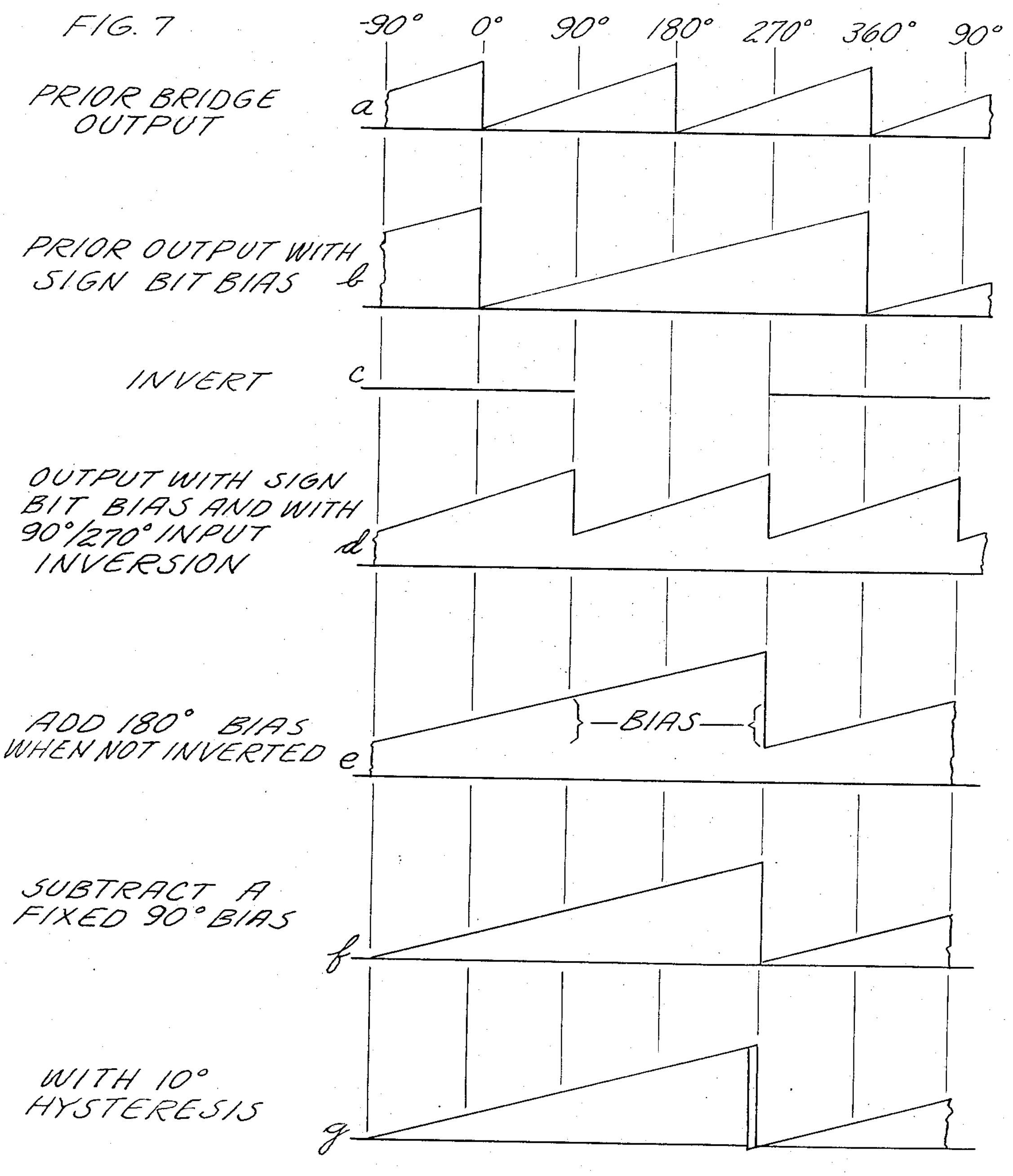
FIG. 7 is an illustration of voltage relationships in the apparatus of FIG. 4.

The solution to the problem, and the modification shown in FIG. 4 for the fine altimeter synchro, are described with respect to FIG. 7. In FIG. 7, illustration A shows the output of the RC/CR bridge per se in the prior copending application. Notice that it varies from minimum to maximum for angles between 0° and 180° as well as for angles between 180° and 360°. To overcome this ambiguity the prior application provides a 180° bias to be added to the output of the device for angles between 180° and 360° so as to provide an unambiguous monotonic output as shown in illustration *b* of FIG. 7.

To overcome the problem of switching at 360°, the present invention uses only one half of the bridge capacity; that is, the present invention will treat the signals provided by the sum and scale circuit 50 so as to reduce by half the angular range of inputs to the RC/CR bridge 56; it does this by inverting the outputs of the sum and scale circuit on the lines 52, 54 for angles between –90° and +90° (and angles between 270° and 90°). This particular range of angles for inversion is chosen simply to provide use of the RC/CR bridge in mid-range centered about 180°. Thus the use of the bridge is a maximal distance away from 0° and from 360°. The inversion is provided by selective inverters 94, 96 in response to a signal on a line 106 which designates outputs of the sum and scale circuit 50 which are equivalent to angles of between 270° and 90° of angular rotation, as is described more fully hereinafter. Thus the angles for which an inversion is provided is shown in illustration *c*. By taking illustration b and causing a 180° shift therein for angles between –90° and 90° (and between 270° and 90°), the result is as shown in illustration *d*. Thus between 90° and 270° illustration *d* is the same as illustration *b*. However between 270° and 90° the bridge output will be the same as 270° minus 180° to 90° minus 180°, or will be the same as illustration *b* between 90° and 270°. However, illustration *d* now shows that the result is ambiguous since it is not monotonic for a full revolution of the shaft. To overcome this, during the period where there is no inversion (90°–270°) a 180° bias is applied as shown in illustration *e* of FIG. 7. Notice that this provides an output which does not return to zero. Therefore a fixed bias equal to –90° of rotation can be added into the result so as to provide a monotonic function of shaft angles which goes from a zero to a maximum from –90° to 270°, as shown in illustration *f* of FIG. 7. This provides an output which is zero to full scale for angles between –90° and +270°, which in the present instance is convenient since this allows developing altitude signals starting at –1250 feet (recalling that the fine altimeter of the present embodiment covers 5000 feet per revolution).

Provision of the inversion and bias controls at 90° and 270° is in response to the summation of the signals on the lines 52, 54 from the sum and scale circuit 50. These signals, as shown in the aforementioned copending application, equal $$V_{52} = k_1 \sin(\theta + 45) \sin wt \quad (1)$$

$$V_{54} = k_1 \cos(\theta + 45) \sin wt \quad (2)$$

The output of a summing amplifier 106 on a line 108 equals $$V_{108} = k_1 [\sin(\theta + 45) + \cos(\theta + 45)], \quad (3)$$

and through trigonometric identity this can be expressed as $$V_{108} = k_1 [\sin\theta\cos 45 + \cos\theta\sin 45 + \cos\theta\cos 45 - \sin\theta\sin 45] \quad (4)$$

Since at 45° the sine equals the cosine, two terms drop out and the expression becomes $$V_{108} = k_1 (2x\ .707 \cos\theta) \sin wt \quad (5)$$

Thus, this is an expression of the cosine of $\theta$ which necessarily changes from positive at 90° and from negative to positive at 270°. Synchronously demodulating at the carrier frequency (wt = 400 Hz in this embodiment) will provide a DC signal varying with cos $\theta$, which is positive for angles of –90° to 90° (and angles of 270° to +90°), which coincides with the period of time when the inversion is to take place as shown in illustration c of FIG. 7. The summation signal on line 108 is applied to a synchronous demodulator 110 which has, as its reference phase input, a square wave version of the carrier signal on a line 86, developed by the saturation amplifier 87. The cosine signal at the output of the synchronous demodulator 110 is applied to a summing circuit 114, the purpose of which is described hereinafter, to provide a signal on the line 106 which is present from –90 to +90 (or from 270 to + 90°). This signal is used to cause the selective inverters 94, 96 to invert the signals at their inputs 52, 54 before applying them to the outputs 98, 100 respectively. The selective inverters may simply comprise a differencing amplifier of the type wherein the noninverting input has twice the gain of the inverting input, with an electronic switch to short out the noninverting input in the case where inversion is required. This is shown and described in more detail in a commonly owned copending application of J. E. Games, Ser. No. 268,256 filed on even date herewith and entitled ANALOG DIVIDER AND NAVIGATION COMPUTER. The signal on the line 106 is also applied to an electronic switch 116 so as to connect a DC bias source having a magnitude equivalent to 180° of rotation of the synchro, from a source 118 through the switch 116 to the summing circuit 102 so as to provide the 180° bias value as shown in illustrations *d* and *e* of FIG. 5. The switch 116 must respond to the opposite polarity of the signals as do the switches in the selective inverters 94, 96, or an inversion can be applied; for instance, typically the switches will comprise field effect transistors which may be caused to conduct either in response to positive or negative signals depending on the choice of conductivity type; otherwise, the proper inversion of the signal may be utilized as necessary.

The combinational sign logic 88 operates exactly as described in the aforementioned copending application; that is, it senses outputs of the RC/CR bridge 56 which are above 180° and generates a signal on the line 90 to indicate, in this embodiment, when shaft angles being resolved are between 180° and 270°. This is used to operate a switch 120 to add in an additional 180° of bias for angles of between 180° and 270°, as shown in illustrations *b* and *d* of FIG. 7. This bias is passed through the switch 120 from a suitable DC source 122 having a magnitude equivalent to 180° of shaft rotation for addition with the other signals in the summing circuit 102. The summing circuit 102 also receives the −90° of bias shown in illustration *f* of FIG. 7. from a suitable voltage source 124.

The purpose of the summing amplifier 114 is to introduce hysteresis into the switching of the unit at the transition from maximum to minimum output at 270°. This hysteresis is shown in illustration g of FIG. 7. It should be understood that the provision of hysteresis, which is about to be described, is optional, and need not be used unless it is so desired. This is due to the fact that the switching herein is synchronized without ambiguity, or opportunity for race conditions, and the fine altitude output on the line 20 will be properly responsive. However, if the fine altimeter is jittering just at 270°, various transients might be established in certain utilizations of this aspect of the invention which could prove to be bothersome.

The hysteresis is achieved by adding into the summing amplifier 114 a voltage which may have a magnitude proportional to on the order of 10° of shaft rotation, whenever inversion takes place (which is between 270° and 90°). This is achieved by the switch 126 responding to the inversion command signal on the line 106 which passes a bias voltage from a source 128 to the summing amplifier 114. Since the output of the synchronous demodulator 110 is a DC signal having a magnitude varying with the cosine of the altimeter shaft angle, and the cosine is zero at 90° and at 270°, by providing an input which is equivalent to some small number of degrees of synchro output, even though the output of the synchronous demodulator on the line 112 crosses zero and becomes negative, the bias input continues to maintain an output from the amplifier 114 so as to continue to cause the selective inverters 94, 96 to provide an inversion of the signal inputs to the bridge 56. Thus instead of looking to the bridge like 270° it looks to the bridge like 90°; this is bucked out by the −90° bias from the source 124 leaving an output of exactly 0 voltage at exactly 270°, and at any small angle less than 270°, it is adding a −90° bias to a plus angle value which is just less than 90°, so that a negative output results as shown in illustration *g* of FIG. 7. Since, as described hereinbefore, the staircase voltage is created by transitions, and the hysteresis just described will prevent that transition for a few extra degrees below 270, no transition will occur. Also, since the output of the apparatus of FIG. 4 goes negative, the coarse/fine combining means of FIG. 2 will stay on the same staircase but there will be a voltage subtracted therefrom which is proportional to the fine synchro angle so it will remain accurate. Once the shaft angle becomes less than 270° minus the equivalent bias (10° as shown in FIG. 4), then the transition will occur, but the output will indicate less than 270° so that the next lower stairstep will be used with a correct fine voltage and smooth, linear operation is maintained.

The hysteresis need not be used in any case where it is not desired; since this aspect of the invention has wide utility to provide completely unambiguous resolution of the synchro even using filtered DC output, while employing an RC/CR bridge as the basic resolution unit, there are many instances where this aspect of the invention may be applied to advantage without the need for the hysteresis.

In order to condition the coarse synchro, little modification of the apparatus of the aforementioned copending application is required. Specifically, in the present embodiment, only altitudes below 45,000 feet are significant since that is an upper limit of commercial aircraft flights. Since the coarse altimeter indicates a maximum (at 360°) of 135,000 feet, it is seen that only a half revolution of the coarse altimeter need be decoded since it cannot enter into a second half revolution without exceeding commercial altitude limits. Therefore, ambiguity at the transition from one half revolution to a second half revolution (which is inherent in the RC/CR bridge) need not be encountered in the coarse altimeter signal processing. Thus, as illustrated in FIG. 8, the coarse altimeter synchro 140 may be resolved to provide the coarse altitude signal on the line 16 simply by filtering the output of the pulsewidth modulator 70, all as is completely described in the aforementioned copending application. However, in order to get negative altitude readings from the coarse altimeter, without having a transition when going from 0°+ to 0°−, it is well to bias the input signals to the bridge 56 by altering the scaling factors in the sum and scale circuit 50a so as to provide signal inputs to the bridge 56 which will provide zero output at a negative altimeter reading and increase linearly therefrom.

Thus, constants are provided in the sum and scale circuit so that the RC/CR bridge will null at shaft angles of −45°, and no transition problems occur because the bridge will not have to recognize shaft rotations of more than 135°.

The derivation of the scaling factors is similar to that shown in equations (5) - (14) of the aforementioned copending application. The desired outputs are $$V_{52} = k_3 \sin wt \sin (\theta + 90) = k_3 \sin wt \cos \theta \quad (6)$$

$$V_{54} = k_3 \sin wt \cos (\theta + 90) = -k_3 \sin wt \sin \theta \quad (7)$$

It is seen that since $$V_{46} + V_{48} = -k_2/2 \sin wt\ (2\sqrt{3} \cos\theta) \quad (8)$$

and
$$V_{46} - V_{48} = -k_2/2 \sin wt\ 2 \sin\theta \quad (9)$$

then $$V_{52} = k_2/k_3\ \sqrt{3}\,(V_{46} + V_{48}) \quad (10)$$

and $$V_{54} = k_2/k_3\ (V_{46} - V_{48}) \quad (11)$$

so that in FIG. 3 of the aforementioned copending application $V_{46}$ is applied to $R_1$ and $V_{48}$ is applied to $R_2$ without inversions; $R_1$ must equal $R_2$, and $R_3$ must equal $$R_3 = k_2/k_3\ \sqrt{3} \quad (12)$$

Similarly $V_{46}$ will be applied to $R_4$ without inversion and $V_{48}$ will be applied to $R_5$ with inversion, $R_4$ is made equal to $R_5$ and $R_6$ equals $$R_6 = k_2/k_3\,. \quad (13)$$

The transition from maximum to minimum at −90° or 270°, as shown in illustration f of FIG. 7 is achieved herein because of the fact that the input to the RC bridge is inverted from 270° up through 90°. If, instead, the inversion were provided between 90° up through 270°, the bridge would null when the synchro had a shaft angle of plus 90°. Similarly, other angles such as ± 45° and even different angles such as inversion for −90° to +45° may be utilized if desired. This of coarse provides wide latitude in the choice of the point at which the bridge nulls (which one revolution later is the point of maximum output). The bias may vary, however, as desired. For instance by providing the inversion as shown in FIG. 7 herein, but adding bias of 180° during the inverted period and subtracting a constant bias of 270°, then the bridge would null at −90°. So that, in general, one may provide 180° of bias during the inversion or one may supply 180° of bias to the non-inverted angles; in either case, it is necessary to subtract a constant bias proportional to the angle at the upper end of the range of angles over which bias is provided. The inversion may be applied in equal portions of a revolution, or for a greater or lesser portion thereof as desired. As is illustrated in FIG. 7, this is obviously a simple matter of trigonometry, following the inventive teachings herein. If desired, filters may be applied to the signals prior to application to the RC/CR bridge in order to desensitize the bridge to any harmonics which might be present in the 400 Hz carrier signal. Also, although the fixed 90° bias is shown as being added prior to filtering in FIG. 4, if desired, the bias voltage from the source 124 may be summed with the output of the filter rather than being applied directly to the summing circuit 102, since this bias is constant.

Although the invention has been shown and described with respect to preferred embodiments thereof, it should be understood by those skilled in the art that the foregoing and various other changes and omissions in the form and detail thereof may be made therein without departing from the spirit and the scope of the invention.

Having thus described typical embodiments of our invention, that which we claim as new and desire to secure by Letters Patent of the United States is:

1. A coarse/fine synchro altimeter converter comprising:

means responsive to separate signals respectively representing coarse altitude and fine altitude to develop a coarse voltage staircase as a function of altitude, the increments in said staircase being equivalent to the maximum altitude range represented by said fine altitude signal;

means responsive to said coarse voltage staircase for generating a precision voltage staircase of substantially the same magnitude as said coarse voltage staircase for any give altitude represented by said coarse and fine altitude signals; and means for summing said precision voltage staircase with said fine altimeter signal to provide a single signal indicative of altitude to substantially the same degree of precision as said fine altimeter signal.

2. An altimeter converter according to claim 1 wherein said precision staircase generating means includes a precision D/A converter.

3. An altimeter converter according to claim 2 wherein said precision staircase generating means comprises means for comparing said coarse staircase voltage with said precision staircase voltage;

an up/down counter, the output of which is connected to the input of said precision D/A converter; and means responsive to the output of said staircase comparing means to increase the count in said counter when said coarse staircase exceeds, by substantially one increment, said precise staircase and for causing said up/down counter to count down one count when said precision staircase exceeds, by more than one increment, said coarse staircase voltage.

4. An altimeter converter according to claim 2 wherein said precision staircase generating means additionally comprises a plurality of comparators, each for sensing a distinct increment step in said staircase voltage, the output of said plurality of comparators being utilized to provide corresponding inputs to said precision D/A converter.

5. An altimeter converter according to claim 1 wherein said precision staircase generating means comprises:

means for sensing the voltage level of said voltage staircase; and means responsive to said sensing means for generating a corresponding, precise voltage level.

6. An altimeter converter according to claim 1 wherein said precise staircase generating means comprises:

an up/down counter;

means responsive to the output of said up/down counter to generate a precise voltage corresponding to the count therein; and means comparing said precise voltage with said coarse voltage staircase and for incrementing said counter when said precise voltage is less by one increment than said coarse voltage and for decrementing said up/down counter when said precise voltage is greater by one increment than said coarse voltage.

7. A shaft angle encoder comprising:

means providing differential signals together indicative of mechanical shaft angles;

means responsive to said differential signals to provide an indication of whether the shaft angle is in a first range of shaft angles which fall between a first angle through to a second angle, or in a second range of shaft angles which fall between said second angle through to said first angle, alternatively;

means responsive to said angle range indication means for reversing the phase of said differential signals in one range of angles and not in the other range of angles, and for providing +180° bias in one said range of angles and not in the other of said range of angles;

means providing a negative bias proportional in magnitude to the upper angle of the range of said angles in which said +180° of bias is provided;

an RC/CR bridge means responsive to the outputs of said phase reversing means for providing output signals, the electrical phase of which is related to shaft angle;

means responsive to said bridge output signals for providing an output manifestation representing outputs of said bridge corresponding to shaft angles between 180° and said second angle and providing a basic angle signal representing the output of said bridge and corresponding to the shaft angle;

means responsive to said manifestation for providing a bias signal representing a 180° shaft angle; and means providing a signal proportional to the time average of the sum of said basic angle signal and said bias signals.

8. A shaft angle encoder according to claim 7 and further comprising:

means providing a bias equal to a few degrees of shaft angle and applying said bias to said phase reversing and bias signal providing means, thereby providing for a delay in transition of the operation thereof as said shaft angle decreases from an angle within said range of angles to an angle outside of said range of angles, whereby, within said few degrees below said first angle said means will not alter its phase reversal of said differential signals and will not alter said +180° bias.

* * * * *